United States Patent
Stauf et al.

[11] Patent Number: 5,705,443
[45] Date of Patent: Jan. 6, 1998

[54] ETCHING METHOD FOR REFRACTORY MATERIALS

[75] Inventors: Gregory Stauf, New Milford; Robin A. Gardiner; Peter S. Kirlin, both of Bethel; Peter C. Van Buskirk, Newtown, all of Conn.

[73] Assignee: Advanced Technology Materials, Inc., Danbury, Conn.

[21] Appl. No.: 453,339

[22] Filed: May 30, 1995

[51] Int. Cl.⁶ .................................................. C23F 1/02
[52] U.S. Cl. .................. 438/722; 438/720; 438/714; 438/710; 438/731; 204/192.35; 216/67; 216/75; 216/76
[58] Field of Search ................... 156/345 P, 646.1, 156/643.1, 635.1, 659.1, 656.1; 216/58, 79.7, 65, 67, 107, 75, 76; 204/192.35; 438/710, 720, 722, 727, 731, 714

[56] References Cited

U.S. PATENT DOCUMENTS

| | | | |
|---|---|---|---|
| 5,068,007 | 11/1991 | Rogers et al. | 156/643.1 |
| 5,094,701 | 3/1992 | Norman et al. | 148/23 |
| 5,201,989 | 4/1993 | Douglas et al. | 156/635 |
| 5,204,314 | 4/1993 | Kirlin et al. | 505/1 |
| 5,238,530 | 8/1993 | Douglas et al. | 156/635 |
| 5,262,001 | 11/1993 | Takehara | 156/643.1 |
| 5,312,516 | 5/1994 | Douglas et al. | 156/635 |
| 5,382,320 | 1/1995 | Desu et al. | 156/643.1 |
| 5,387,315 | 2/1995 | Sandhu | 156/646.1 |
| 5,431,774 | 7/1995 | Douglas | 216/65 |

FOREIGN PATENT DOCUMENTS

| | | |
|---|---|---|
| 60-234325 | 11/1985 | Japan |
| 06-151383 | 5/1994 | Japan |
| 6-204184 | 7/1994 | Japan |

OTHER PUBLICATIONS

Perti et al., J. Vac. Sci. Technol. B 12(5) 2970–2975.
Webster's New International Dictionary of the English Language, second Ed. ©1959.
CRC Handbook of Chamistry and Physics, 63rd Ed. ©1982 B–107,126,128,129 and 139.
Droes, S. "Low Temperature Dry Etching of Metal Oxides Via Formation of Metal β–Diketonates," Materials Research Society, Spring 1993, poster presentation.
Droes, S., et al., "Etching of Metal Oxide Thin Films with β–Diketones," Materials Research Society, Spring 1994, presentation.
Scarsbrook, G., et al., "Low temperature pulsed plasma deposition. Part I —a new technique for thin film deposition with complete gas dissociation," Vacuum, vol. 38, Nos. 8–10, pp. 627–631, 1988.

*Primary Examiner*—Martin Angebranndt
*Attorney, Agent, or Firm*—Steven J. Hultquist; Janet R. Elliott

[57] ABSTRACT

A plasma-assisted dry etching process for etching of a metal containing material layer on a substrate to remove the metal containing material from the substrate, comprising (i) plasma etching the metal containing material and, (ii) contemporaneously with said plasma etching, contacting the metal containing material with an etch enhancing reactant in a sufficient amount and at a sufficient rate to enhance the etching removal of the metal containing material, in relation to a corresponding plasma etching of the metal containing material layer on the substrate in the absence of the etch enhancing reactant metal material being contacted with the etch enhancing reactant.

26 Claims, 8 Drawing Sheets

ETCHING METHOD FOR REFRACTORY MATERIALS

GOVERNMENT RIGHTS IN INVENTION

This invention was made with Government Support under Contract No. DAAH01-94-C-R276 awarded by the Advanced Research Projects Agency. The Government has certain rights in this invention.

BACKGROUND OF INVENTION

1. Field of the Invention

This invention relates generally to a dry etching process useful in removing metal films, e.g., of metal per se, or of metal oxides, from substrates on which the metal film has been coated, and more specifically to a plasma etching process of such type.

2. Description of the Related Art

Simple and complex metal oxides such as those which are found in ferroelectric films, high temperature superconducting films and magnetoresistive films are gaining importance for a wide variety of applications such as infrared detectors, volatile and non-volatile computer memories, piezoelectric sensors and transducers, magnetic sensors, and high speed electronics.

In such applications, the demand for higher performance, higher density semiconductor devices is pushing the limits of available materials and process technology. A primary focus of technology development for 256 Megabyte Dynamic Random Access Memory (Mb DRAM) devices and beyond is on new capacitor materials and cell designs. The development of an ultrahigh dielectric constant capacitor module which increases the capacitor storage by a factor of 10–100 relative to currently available ONO dielectric materials would represent a significant technological advance and would allow a flat capacitor cell to be used in 256 Mb DRAMs, and simple stacked capacitors to be adopted for 1 and 4 Gb generations of such memory devices.

One high dielectric constant material which may have significant utility in such memory applications is a perovskite, $Ba_{1-x}Sr_xTiO_3$ (BST) from which capacitors with 30 $fF/mm^2$ and leakage less than 0.1 $mA/cm^2$ (at DRAM operating voltages) have been demonstrated on 150 mm wafers.

Depositing suitable material films for DRAM storage applications requires a highly effective patterning technology. As cell dimensions of memory devices shrink and the number of processing steps grows, the semiconductor industry is moving inexorably towards completely dry processing. Dry etching processes therefore are sought by the industry so that BST and other ferroelectric materials can enable new, denser generations of static random access memory (SRAM) and DRAM structures.

Ion milling, a physical sputtering process, has been proposed for the processing of BST films, but processing rates for such technique are limited to <40 Å/minute. Patterning small geometry Pt structures with ion milling has also proved very difficult. The physical removal mechanism redeposits material on the inside edges of photoresist, resulting in unacceptable "rabbit ears" after photoresist removal, and this issue will be amplified (for both Pt and BST dielectrics) as finer geometries are pursued. For economical production in the semiconductor industry, the fabrication facility must process at least 30 wafers per hour with 1000 Å dielectrics, implying etch rates of at least 500 Å/min. A dry etching process utilizing chemical transport therefore is desired to achieve this rate, as well as to solve the "rabbit ears" problem.

The main technique currently employed for etching semiconductors and materials such as tungsten which are used in semiconductor devices, is reactive ion etching (RIE) using halogen gases. A plasma is used to activate the halogen species, which react with surface atoms to form volatile molecules like $SiF_4$. The volatile molecules then are carried away by the passing gas stream or pumped away in a vacuum system, thereby providing the high rate material removal needed for an economically useful wafer throughput in the fabrication facility.

Unfortunately, some metals such as Ba and Sr do not form halide compounds which have any significant amount of volatility at any temperature which the rest of a semiconductor structure can withstand. Other metals such as Pb have halide compounds with rather low volatility, leading to low removal rates. Thus, most material removal during dry etching of $PbZrTiO_3$, for example, is by physical sputtering, which is comparatively slow and tends to redeposit material nearby, leading to formation of the above-described "ears" and poorly insulating sidewalls which can cause device failure. This problem is even worse with Ba and Sr, which can only be patterned via sputtering or the aforementioned physical ion milling processes. These processes are both very slow and lead to redeposition as discussed above.

The most volatile known compounds for Ba and Sr are the organometallics used as precursors for chemical vapor deposition (CVD) of thin films. Thus a reactive etch which uses these ligands to form volatile compounds on film surfaces would have major advantages such as those which have led to use of reactive etch processes in almost all current semiconductor processing. The difficulty which heretofore has prevented exploration of such a "reverse CVD" process is that thermodynamics and kinetics favor decomposition of the organometallic molecules under typical gas-phase conditions. Thus, such a reverse CVD process would require the input of extra energy to the system, driving the system away from equilibrium, but without decomposing the organic ligands.

Considering the approaches of the prior art in the field of the invention, the art has recognized that metal oxide and ferroelectric films of the type discussed above are quite difficult to etch; in fact, $PbZrTiO_3$ (PZT) has been suggested as an etch mask on Si, in U.S. Pat. No. 5,292,402 issued Mar. 8, 1994 to Norman E. Abt and Sheldon Aronowit.

U.S. Pat. No. 5,382,320 to Seshu B. Desu, et al. discloses the use of organic compounds with halides to etch $PbZrTiO_3$ and $RuO_2$. In such approach, the volatile compounds formed are fluorides and chlorides; the organic portion of the composition is intended to allow the use of gases that do not contribute to greenhouse warming of the earth (i.e., the intent of this prior art process is to avoid $CF_4$, $CCl_4$, etc.).

The pertinent technical literature also discloses etching PZT using halides, in "Reactive ion etching of $Pt/PbZr_xTi_{1-x}O_3/Pt$ integrated ferroelectric capacitors," J. J. Van Glabbeek, G. A. C. M. Spierings, M. J. E. Ulenaers, G. J. M. Dormans and P. K. Larsen, Proc. Mater. Res. Soc. Symp. (1993), vol. 310, p. 127–132; see also "Fluorine ion etching of lead zirconate-titanate thin films", W. M. Lau, L Bello, M. Sayer, and Lichun Zou, Appl. Phys. Lett. (1994), 64(3) p. 300–302, although in such processes, the evidence of a chemically assisted process is not strong.

Some plasma assisted halide etching of YBaCuO superconductors has been reported, but substrate temperatures had to be held above 450° C. to get any substantial rate of etching, and preferential removal of copper was observed, as discussed in "Studies of plasma etching of high temperature superconducting films", M. R. Poor and C. B. Fleddermann, Mater. Res. Soc. Proc. (1989) vol. 190.

The use of $Cl_2$ to chemically enhance etching of $SrTiO_3$ in an electron cyclotron resonance plasma process has been reported, in "Submicron SrTiO3 patterning by reactive ion etching with Cl2 and SF6", Hidemitsu Aoki, T. Hashimoto, E. Ikawa, T. Kikkawa, S. Yamamichi, T. Sakuma and Y. Miyasaka, unknown reference, p. 554–556. Also disclosed in the art is the use of "chlorine and fluorine" chemistries to etch PZT and BaSrTiO3, though the BST had rather low rams, only 100–475 Å/min, and poor sidewall definition (Plasmaquest product literature, vol. 6(2)). In such work, halogens have thus been employed as the primary reactive etch gas constituents.

The art has also described the use of organic compounds in solution, carboxylic acids (U.S. Pat. No. 5,356,516 to C. L. H. Ashby, et al.) or solvents with HF (Swiss Patent CH 664978A issued Apr. 15, 1988), to etch more difficult Ba and Nb/Ta compounds. These are "wet" processes (i.e., they are carried out in the liquid phase rather than the gas phase).

In the area of dry etching processes, the use of hexafluoroacetylacetone in the gas phase to etch CuO, PbO, ZnO, ZnS, $PbZrO_3$, YBaCuO (the copper oxide moiety) and $PbTiO_3$ has been reported ("Low-temperature dry etching of metal oxides and zinc sulfide via formation of volatile metal beta-diketonate complexes," Francois Rousseau, Ajay Jain, Toivo T. Kodas, Mark Hampden-Smith, Doug J. Farr and Ross Muenchausen, J. Mater. Chem. (1992) 2(8) 893–4; see also "New approaches for dry etching metal oxides at low temperature and high rates," Francois Rousseau, A. Jain, L. Perry, J. Farkas, Toivo T. Kodas, M. J. Hampden-Smith, M. Paffett and R. Muenchausen, Mater. Res. Soc. Symp. Proc. (1992) vol. 268, p. 57–62; and "Etching of copper and copper oxide at high rates via generation of volatile copper species," J. Farkas, K. M. Chi, M. J. Hampden-Smith, T. T. Kodas and L. H. Dubois, Mater. Sci. Eng. B (1993) B17 (1–3), p. 93–6), but such dry etching is a purely thermal process, and does not produce high rates for the complex oxides.

"Tungsten etching in pulsed $SF_6$ plasmas", R. Petri, B. Kennedy, D. Henry, N. Sadeghi and J. P. Booth, J. Vac. Sci. Technol. B 12(5) (1994) p. 2970, describes a pulsed plasma etch of W, employing halogens, for the purpose of studying surface chemistry.

The use of hydrogen and acetylacetone or n-Bu acetate in an electron cyclotron resonance (ECR) plasma to etch perovskite oxides, specifically PZT, is described in Daisuke Takehara, Japanese Patent 05102093 published Apr. 23, 1993 (see also U.S. Pat. No. 5,262,001), however, relative to the present invention hereinafter disclosed, no mention is made in this reference of pulsing the plasma, nor is any etch rate enhancement described, nor are any elements other than Pb, Zr, and Ti discussed.

Japanese Patent JP 06151383, published May 31, 1994, of Minoru Hanazaki, et al., for "Plasma apparatus and method for etching $ABO_3$ type ferroelectric oxide films and high melting point metal films in manufacturing thin film capacitors," discusses a plasma process with mixtures of halogen gases, hydrocarbons, alkoxy groups and reducing gases to etch ferroelectric oxide films for capacitors. Specific disclosed etchant gas species include hydrocarbons from methane to butane, a variety of alcohols, acetones, butylacetone, acetylacetones (including hexafluoroacetylacetone), ketones, and numerous halogens. This reference discloses etching of $ABO_3$ complex oxides, where A can be any of Pb, Ba, Sr, Ca, La, Li and B can be any of Ti, Zr, Nb, Mg, Zn, Ta. The reference describes the use of a plasma, and alternating any of first and second gases from the aforementioned gas species, as well as use of the plasma only during injection of one of the gases and not during the injection of the other.

U.S. Pat. No. 5,094,701 to Norman et al. discloses a process for removing metal-containing contaminants from a semiconductor manufacturing substrate, in which the substrate is contacted with a cleaning agent comprising a β-diketone or a β-ketoimine dispersed in an atmosphere which is oxidizingly effective for the metal contaminants at a selected temperature, to form volatile metal-ligand complexes which are sublimed from the surface to leave essentially no residue.

Relative to the method of the present invention as hereinafter more fully described, the Norman et al. '701 patent teaches away from the present invention in such patent's teaching that "[a] broad range of substrates are suitable . . . and include any substrate having metallic-containing surface contaminants wherein the substrate itself does not react with the ligands defined [in the '701 patent]" (column 3, lines 28–34). Representative substrates disclosed in the Norman et al. patent include silicon, glasses, and strontium titanate. Examples are set out in the patent involving cleaning of Cu, Pb, Sn, Fe, In, oxides, and Cl, but the disclosed process failed in cleaning Au. The examples in the patent cover a wide variety of ligand species, but complex metal oxides are not addressed at all (i.e., the patent teachings are directed to compounds of the formulae MO, $MO_2$, $MO_3$, $M_2O$, and $M_2O_3$). Further, the patent's disclosed process does not utilize a plasma.

U.S. Pat. Nos. 5,201,989; 5,238,530; and 5,312,516 to M. A. Douglas, et al. variously describe anisotropic wet etch processes for niobium pentoxide, titanate (e.g., PZT), and tantalum pentoxide substrates, using inorganic acids, HCl and HF, with possible use of basic or salt solutions. These processes require the use of light for patterning, and are fundamentally different from the dry plasma etch technique of the present invention, as hereinafter more fully described.

In addition to the above-discussed application of removing metal oxide films from substrates on which such films have been coated, there is a need in the art for improved methods of removing metal films per se from selected areas of a substrate on which same have been coated. Examples include the removal of metal from edge regions and lead electrode attachment regions of equal-coated polymeric film materials used as electrode layers in the manufacture of electroluminescent strip lighting elements, as well as the manufacture of microelectronic devices on wafer substrates, e.g. field emitter devices, in which removal may be required of metal electrode layers, selective etch formation of x-y address structure, etc.

Accordingly, it would be a significant advance in the art of metal film etching technology, and is correspondingly an object of the present invention, to provide a process for dry etching of metal films, e.g., of metal per se, or of metal oxide films, which is carried out at high rate in a simple and efficient manner.

It is another object of the invention to provide such a dry etching method which employs reactive species which are contacted with the metal film to enhance the selective removal of the metal film material from the substrate.

It is a further object of the present invention to provide a method of the aforementioned type, which is readily utilizable in the semiconductor manufacturing industry, in the fabrication of products such as SRAM and DRAM memory devices.

It is another object of the present invention to provide a novel chemically assisted etching process useful for the fabrication of integrated microelectronic devices utilizing thin metal oxide films containing Group II metal species.

Other objects and advantages of the invention will be more fully apparent from the ensuing disclosure and appended claims.

SUMMARY OF THE INVENTION

The present invention relates broadly to a plasma-assisted dry etching process for removal of a metal containing film from a substrate having such film coated thereon, e.g., over a selected area portion of the metal containing film on the substrate.

More particularly, the invention relates to a plasma-assisted dry etching process for etching of a metal containing material layer on a substrate to remove the metal material from the substrate, comprising (i) plasma etching the metal material and, (ii) contemporaneously with said plasma etching, contacting the metal material with an etchingly enhancing reactant. The etch enhancing reactant is applied in a sufficient amount and at a sufficient rate to enhance the etching removal of the metal containing material.

As used herein, the terms "enhance," "enhancingly," or "enhanced," in reference to the metal etch removal process of the invention means enhancement of the rate, quality, and/or extent of etch removal, in comparison with a corresponding plasma etching process conducted without contacting the metal containing material with the etch enhancing reactant.

As used herein, the term "contemporaneously" means, in reference to the (i) plasma etching and (ii) reactant contacting steps in the process of the invention, conducting such steps (i) and (ii) simultaneously, or sequentially carrying out such steps (i) and (ii), in a substantially continuous manner. When steps (i) and (ii) are conducted in sequence, with either (i) or (ii) being carried out as the first step, followed by the other, it typically is desirable to repetitively carry out such sequence of steps for a sufficient time to effect the desired extent of metal containing film material removal.

As used herein, the terms "metal containing film" and "metal containing material" are intended to be broadly construed to include metals per se, as well as metal-containing film and material compositions, such as oxides or other compounds of metals per se.

As used herein, the phrase "etch enhancing reactant" means a reactant which when contacted with the metal containing film on the substrate is reactive therewith (by chemical and/or physical interaction) to facilitate the removal of the metal containing film in the plasma etch process. The removal of the metal containing film in the plasma etch process, as enhanced by contacting with the aforementioned etch enhancing reactant, may be enhanced by such reactant in any suitable manner (e.g., involving physical, chemical, and/or thermal effects), with the result that the rate, quality, and/or extent of etch removal is improved.

In the process of the invention, the contacting of the metal containing material with the etch enhancing reactant may be carried out concurrently with the plasma etching. In a specific embodiment, the contacting of the metal containing material with the etch enhancing reactant comprises directing the etch enhancing reactant at the metal containing material, in proximity thereto. The plasma etching is carried out so that the plasma is substantially non-interfering in relation to the reaction between the etch enhancing reactant and the metal containing material.

In another embodiment of the inventive process, the plasma etching comprises pulsed plasma etching of the metal containing material. As mentioned hereinabove, the steps (i) and (ii) can suitably be carried out sequentially and repetitively, to substantially completely remove the metal containing material from the substrate.

The plasma may for example be pulsed to repetitively and sequentially carry out steps (i) and (ii) in the process of the invention, by any suitable pulsing means and/or method conventionally employed in the art to effect a pulsed plasma exposure of a target to a plasma medium. By way of example, the plasma may be mechanically pulsed, by intermittently blocking same from exposure to the substrate, e.g., with the intermittent blocking being effected by interposing a rotating chopper blade between a source of said plasma, and said substrate. Alternatively, the plasma may be pulsed by modulating the power to the plasma generator, by pressure modulation, modulation of flow of the plasma, or modulation of the bias potential of the substrate, or combinations of such pulsation-inducing plasma exposure techniques.

When the metal containing material on the substrate is a metal oxide (MOX) material, the plasma etching may comprise exposing the metal containing material to a plasma which is reducingly effective for the metal containing oxide film coated on the substrate. When the metal containing material on the substrate is a metal per se, such as platinum or other noble or refractory metal, the plasma need not be of a reducing character. In general, any plasma medium which is effective for the removal of the metal containing material in the process, may advantageously be employed. When the metal containing material comprises a metal oxide, and a reducing plasma exposure is desired, the plasma employed in the practice of the invention may for example comprise an inert gas species, and a reducing gas species, with the inert gas species comprising a gaseous species selected from the group consisting of helium, argon, neon, xenon, and krypton, and with the reducing plasma comprising a reducing gas species selected from the group consisting of ammonia, amines, imines, hydrogen, and C1–C4 hydrocarbons, such as methane or ethane.

In one embodiment of the method broadly described above, the etch enhancing reactant and the metal containing material are reacted, to form a reaction product on the substrate including metal complexed ligand which is volatilizable (thermally removable) upon exposure to the plasma; and the resulting metal complexed ligand on the substrate then is exposed to the plasma, to volatilize the metal complexed ligand and thereby remove the metal from the substrate.

In the practice of the invention, the metal containing material may comprise a metal per se and/or a metal oxide of a metal selected from the group consisting of: Cu, Ba, Sr, La, Nb, Nd, Ce, Pr, Sm, Eu, Th, Gd, Ta, Tb, Ti, Zr, Pt, Au, Ag, Ir, Rb, Ru, Re, Rh, Dy, Ho, Er, Tm, Yb, Lu, Bi, Tl, Y and Pb.

The etch enhancing reactant in the process of the invention may in one aspect comprise a monodentate or multidentate organic ligand which is coordinatable to the metal of the metal material to yield a metal containing complexed ligand which is volatilizable or otherwise thermally removable in the plasma exposure to enhance the metal removal from the substrate. The ligand species may comprise at least one member selected from the group consisting of β-diketonates, cyclopentadienyls, alkyls, perfluoroalkyls, alkoxides, perfluoroalkoxides, and Schiff bases, e.g., at least one member selected from the group consisting of the group consisting of:

(i) 2,2,6,6-tetramethyl-3,5-heptanedionate;
(ii) 1,1,15,5,5-hexafluoro-2,4,-pentanedionate;
(iii) 1,1,1,2,2,3,3-heptafluoro-7,7-dimethyl-4,6-octanedionate;
(iv) cyclopentadienyl;
(v) 4,4'-(ethane-1,2-diyldiimino) bis (3-pentene-2-one);
(vi) pentamethylcyclopentadienyl and other substituted cyclopentadienyls;
(vii) 2,4-pentanedionate;
(viii) 1,1,1-trifluoro-2,4-pentanedionate; and
(ix) ligands capable of coordinating with and forming volatile compounds of metals such as Pd, Ir, Pt, and Rh.

Other aspects and features of the present invention will be more fully apparent from the ensuing disclosure and appended claims.

DETAILED DESCRIPTION OF THE INVENTION, AND PREFERRED EMBODIMENTS THEREOF

Figure 1:
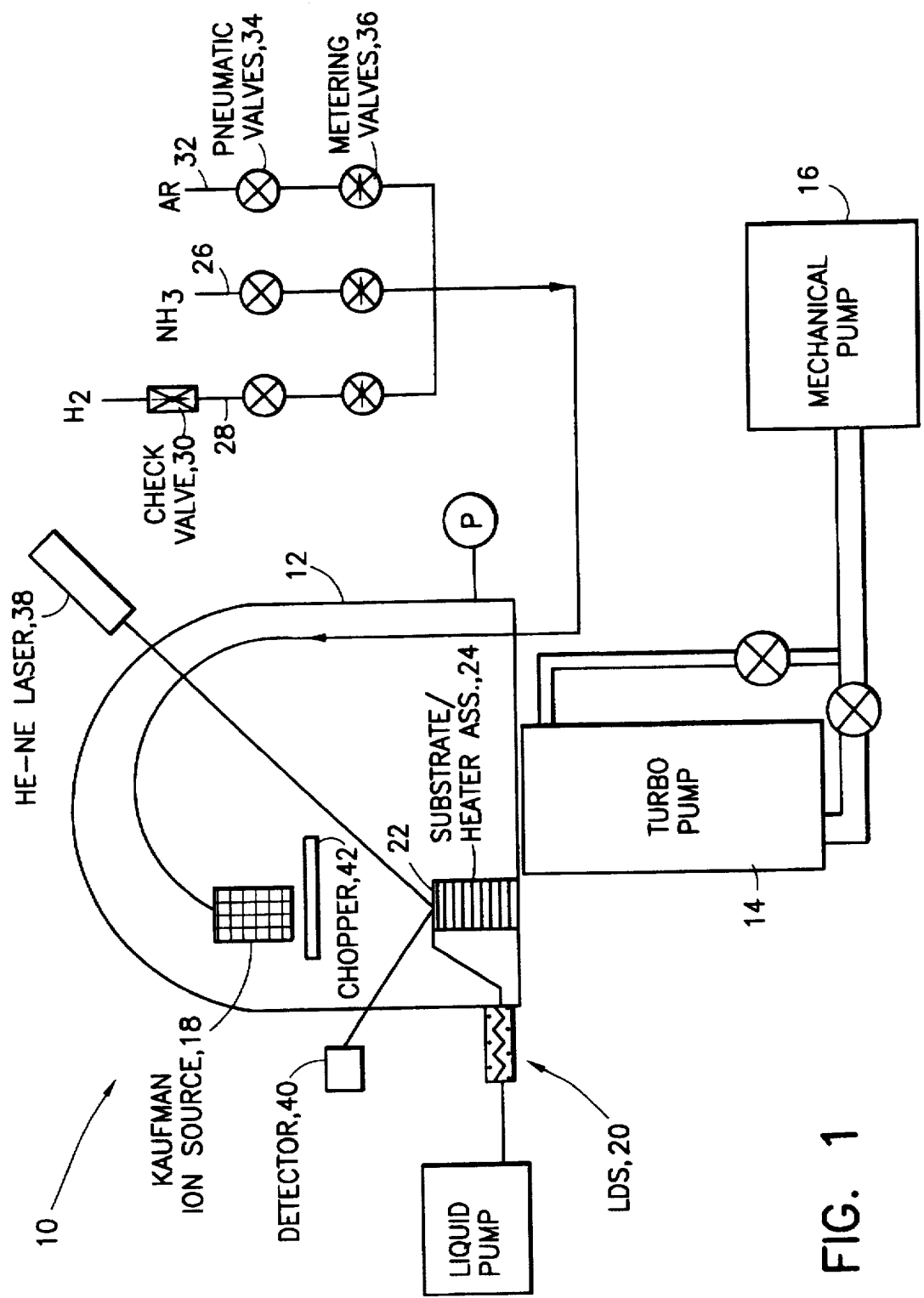
FIG. 1 is a diagram of a process system for carrying out the process of the invention, including a dry etching chamber, and an ion source and delivery tube for organic ligands to chemically assist the etching process, with an optical reflectometer system for in-situ measurement of etch rate.

The etching process of the present invention permits the effective etch removal of selected portions of metal containing film material from a substrate. The invention may for example be usefully employed to remove from a substrate simple and complex metal oxides such as those employed in ferroelectric films, high temperature superconducting films and magnetoresistive films, for applications such as infrared detectors, volatile and non-volatile computer memories, piezoelectric sensors and transducers, magnetic sensors and high speed electronics. Examples of such metal containing films include barium strontium titanate (BST), lead zirconium titanate (PZT), and strontium bismuth tantalate (SBT).

In the plasma-assisted dry etching process of the invention for etch removal of selected portions of metal containing film material such as a metal or MOX film from a substrate, the metal-coated surface is exposed to a plasma which is effective to etch away the metal film. Contemporaneously, the surface is contacted with the etch enhancing reactant, which interacts with the film on the substrate to enhance the etch removal of the film.

While the constituent steps of (i) plasma etching and (ii) etch enhancing reactant contacting, may be conducted either simultaneously or sequentially, and either continuously or in intermittent manner, and if sequential, in a single sequence, or alternatively in a continuing alternating and repeating manner, the invention will be described primarily hereinafter in respect of an illustrative MOX film etching embodiment in which the steps (i) and (ii) are carried out in a sequential and repetitive manner, involving a reducing plasma, and as the etch enhancing reactant, an organic ligand source which may complex with the metal containing film components to yield a reaction product which facilitates the etch removal of the film from the substrate. It will be recognized, however, that the utility and practice of the invention are not thus limited, and that other, elemental metal or metal compound films as well as other, non-reducing plasmas, and other etch enhancing reactants may be employed within the broad scope of the present invention.

In the practice of the present invention, the metal containing film material on the substrate may for example comprise a metal selected from the group consisting of: Cu, Ba, Sr, La, Nb, Nd, Ce, Pr, Sm, Eu, Th, Gd, Ta, Tb, Ti, Zr, Pt, Pd, Au, Ag, Ir, Rb, Ru, Re, Rh, Dy, Ho, Er, Tm, Yb, Lu, Bi, Tl, Y and Pb.

In the general practice of the present invention, the plasma may utilize any plasma medium and components which are efficacious for the removal of the specific metal containing film material being processed. For example, the plasma may comprise an inert gas species, which is non-reactive with the metal containing film material (e.g., helium, argon, neon, xenon, and krypton), and an active component which is reactive in character, e.g., reducing gases such as ammonia, amines, imines, hydrogen, C1–C4 hydrocarbons such as methane or ethane, or other active gas species. The plasma may be devoid of halogen constituents, if desired, or may otherwise be constituted or formulated for etching of the specific metal containing film material on the particular substrate. The etchingly enhancing agent may comprise any suitable reagent(s), e.g., a monodentate or multidentate organic ligand which is coordinatable to the metal of the MOX material to yield a metal complexed ligand. Suitable ligand species may for example comprise at least one member selected from the group consisting of β-diketonates, cyclopentadienyls, alkyls, perfluoroalkyls, alkoxides, perfluoroalkoxides, and Schiff bases. Specific ligand species which are potentially usefully employed in the broad practice of the invention include:

(i) 2,2,6,6-tetramethyl-3,5-heptanedionate;
(ii) 1,1,15,5,5-hexafluoro-2,4,-pentanedionate;
(iii) 1,1,1,2,2,3,3-heptafluoro-7,7-dimethyl-4,6-octanedionate;
(iv) cyclopentadienyl;
(v) 4,4'-(ethane-1,2-diyldiimino)bis(3-pentene-2-one);
(vi) pentamethylcyclopentadienyl and other substituted cyclopentadienyls;
(vii) 2,4-pentanedionate;
(viii) 1,1,1-trifluoro-2,4-pentanedionate; and
(ix) ligands capable of coordinating with and forming volatile compounds of metals such as Pd, Pt, Ir, and Rh.

In respect of the foregoing discussion of the invention, we do not wish to be bound by any theory or hypothesis as regards the mechanism of action or interaction of the steps of (i) plasma etching and (ii) etch enhancing reactant contacting in the process of the invention. It will be recognized that the invention may be advantageously carried out without undue experimentation, under varying conditions and with varying plasma media and etch enhancing agents, and with the choice of specific process conditions, plasma and etch enhancing agent depending on the specific metal containing film and substrate involved.

In a specific example of the process of the invention, wherein the metal containing material layer on the substrate comprises an MOX film, the etching plasma may for example comprise gases such as hydrogen or ammonia, for reduction of the metal oxide film. In a sequential embodiment of the process, involving plasma exposure followed by contacting of the metal containing film with the etchingly enhancing reactant, the plasma exposure then may be stopped, either by electrically "pulsing" off the plasma or by physical blockage thereof, while an organic ligand is introduced and allowed to react with the reduced surface layer of the oxide material.

After such reaction, the plasma again is allowed to contact the surface, for the purpose of stimulating rearrangement of the adsorbed ligands and surface atoms to form volatile species and providing energy for direct desorption of partially reacted complexes. Surface reduction of the exposed material also takes place, preparing the metal oxide film on the substrate for another cycle of ligand exposure and reaction. Metal oxide film material thereby is removed in a highly efficient manner.

In using a mechanical chopper to repeat the above-described process steps at a high rate, etch rate increases as high as 200% were observed with hfac ligand, relative to corresponding sputtering processes using the same species. The observed increase in etch rates coupled with appertaining IR and XPS data strongly evidence the occurrence of chemical reactions forming volatile metalorganic compounds. In addition, there is substantially less surface damage with a metalorganic enhanced ion milling (MEIM) process than with Ar milling, previously the only way to dry pattern these thin films. This process thus solves the prior art problem of a lack of a useful reactive etch process for complex oxides.

FIG. 1 is a schematic representation of an etching system 10 for carrying out the process of the invention in one embodiment thereof.

The system comprises a vacuum bell jar etching chamber 12 which is constructed and arranged so as to be capable of high $10^{-7}$ torr vacuum with no gas flow, and which can attain $10^{-4}$ torr vacuum levels with typical process gas flows via its 1200 l/sec turbo pump 14 backed by a Leybold D60 mechanical pump 16. A Commonwealth Scientific 2 cm Kaufman ion source 18 may be used for energetic ion and radical bombardment; it has the advantage that it permits independent and measurable control of beam current (energetic species flux) and voltage (impact energy). A flash vaporizer liquid delivery system 20 for organic ligand delivery may be constructed and arranged in accordance with U.S. Pat. No. 5,204,314 to Peter S. Kirlin, et al.

In the system shown in FIG. 1, described hereinafter in respect of the etching of a BST film on the substrate 22, organic ligands may be susceptible to decomposition by the energetic ions in the ion beam. For this reason, the ligands are preferably not injected into the plasma in the Kaufman source, but rather are introduced very near the substrate 22 disposed on the heater assembly 24. The reactions of the ligands with the metal oxides in the film are promoted if the metals are first reduced. For such purpose, reducing gases, either ammonia (in inlet line 26) or hydrogen (in inlet line 28 equipped with check valve 30), are introduced into the plasma source 18 along with argon (in inlet line 32). As shown, the respective lines 26, 28, and 30 are each equipped with pneumatic valves 34 and metering valves 36. A He—Ne laser 38 is mounted on the system to allow in-situ monitoring of etch rate. The BST film on substrate 22 is transparent, and a highly reflective Pt bottom layer allows real-time monitoring of the BST thickness based on changes in the reflected light intensity. As material thickness changes during etching, constructive or destructive interference causes periodic intensity changes in the reflected optical signal, which correspond to film optical thickness n·t. A continuous record is made of intensity changes, via detector 40, giving an approximately sinusoidal trace (actually the destructive interference range is smaller than the constructive interference range, leading to wider "peaks" and narrower "valleys" for the sinusoid). The regions between the peaks and valleys are used to determine etch rates, both because the optical signal is changing approximately linearly with thickness (over short ranges), and because signal change is the largest per unit thickness change in those regions.

In the FIG. 1 system, the detector 40 comprises an optical reflectometer system for in-situ measurements of etch rate.

A chopping blade 42 is used to pulse the plasma. The blade is formed of stainless steel, and rotates about a vertical axis about 1 inch under the ion gun neutralizer filament in the position shown in FIG. 1. The circular blade has three equal sections taken out, so that for each rotation of the motor and blade, three chops of the ion beam take place. Thus, for example, a 300 rpm motor speed may be employed to effect a 15 Hz chop rate at the beam. It is to be noted that in comparison to steady state etch rates, the beam in the FIG. 1 system is blocked by the chopper for ½ the time, so attainable etch rates with a variably controlled duty cycle (say 80% on, 20% off) may be higher.

Data from both etching experiments using an etching system of the type shown in FIG. 1 and surface characterization experiments were combined to interpret the effects observed in the practice of the method of the present invention. First it is necessary to define the wide variety of material removal mechanisms which may be occurring during the etch process, either in series or simultaneously. The simplest removal process is ion milling, which is a physical sputtering process in which bombardment of energetic species knocks atoms off a surface. Once chemical reactions are introduced, the possibilities become more complex. After a ligand is adsorbed on the surface, it can be rearranged to form a polymer by energetic ions or heat, or it can be desorbed relatively intact by stimulation by energetic ions or by heat. It can also bond to a surface atom in the film, and the single ligand/metal atom combination can be desorbed by heat or sputtering effects. Rearrangement and combination with other ligands can also take place to form a fully saturated volatile metalorganic compound, which can desorb by heat or bombardment. These possibilities are summarized in Table 1 below.

TABLE 1

Definition of material removal mechanisms.

| Removal mechanism | Definition |
| --- | --- |
| physical sputtering | physical sputtering (ion milling) of Ba, Sr and Ti film |
| ligand desorption | organic ligands are physically adsorbed, and bombardments induces desorption |
| metalorganic sputtering | organic ligands become chemically bound to the surface species; metalorganic compound has higher sputter yield and transport from the surface is physical |
| metalorganic sublimation | Equilibrium surface temperature results in sublimation of the metalorganic complex |
| metalorganic sublimation | Non-equilibrium energy due to energetic bombardment ("thermal spike") results in sublimation of the metalorganic complex |

In addition to these effects which involve material removal, there are secondary effects which may take place during the etching process. These secondary effects can change the apparent rate of material removal but without involving the surface processes described above. The presence of a substantial background pressure of ligand may affect the plasma in the ion gun, giving rise to radicals which are not present otherwise, or radicals may be generated as the beam passes through the complex organic compounds in the chamber. These energetic species may enhance or decrease sputtering rate. Additionally, the ion beam current or voltage seen by the substrate may be lowered due to passage of the beam through this ligand background, thus lowering the physical removal rate.

These effects, which may be happening simultaneously but at varying rates with changed bombardment conditions, are accommodated by the present invention by separating the reactant exposure and plasma exposure steps. Such separation can in principle be either spatial or temporal. The former may be advantageous when the etch removal process requires a relatively low flux of reactant and/or plasma, e.g., where the reducing species and organics results in little gas phase or premature surface interactions. High rate metal containing material removal more desirably involves temporal segregation of the reactant exposure and plasma exposure steps via plasma pulsing. The specific operating conditions and process parameters for the practice of the process of the present invention can readily be determined by those of ordinary skill in the art without undue experimentation.

The features and aspects of the invention are more fully illustrated by the following examples, which are of an exemplary and embodimental character, and thus are not to be limitingly construed as regards the scope and character of the process of the present invention. These following examples were carried out using apparatus arranged and operated in accordance with the FIG. 1 embodiment hereof, as hereinabove described.

EXAMPLE 1

Experiments were conducted with organic ligands of types expected to form volatile compounds. Simply adding organic ligands into the gas phase of the etching system while the ion beam was operating turned out to slow etching somewhat. This may have been due to either reduction of ion beam intensity at the substrate due to additional ion collisions with gas molecules, or to decomposition of the precursors by the ion beam, forming carbon and fluorocarbon polymers on the surface of the film. This was not an unexpected result, so more sophisticated experiments were performed. In particular, surface activation/reduction (which necessarily involved some physical etching) was first carried out using the ion beam. After turning the beam off the ligand was admitted to the chamber, and reflection vs. time was monitored to indicate any thickness change due to surface reactions. A typical trace from such an experiment is shown in FIG. 2 hereof.

Figure 2:
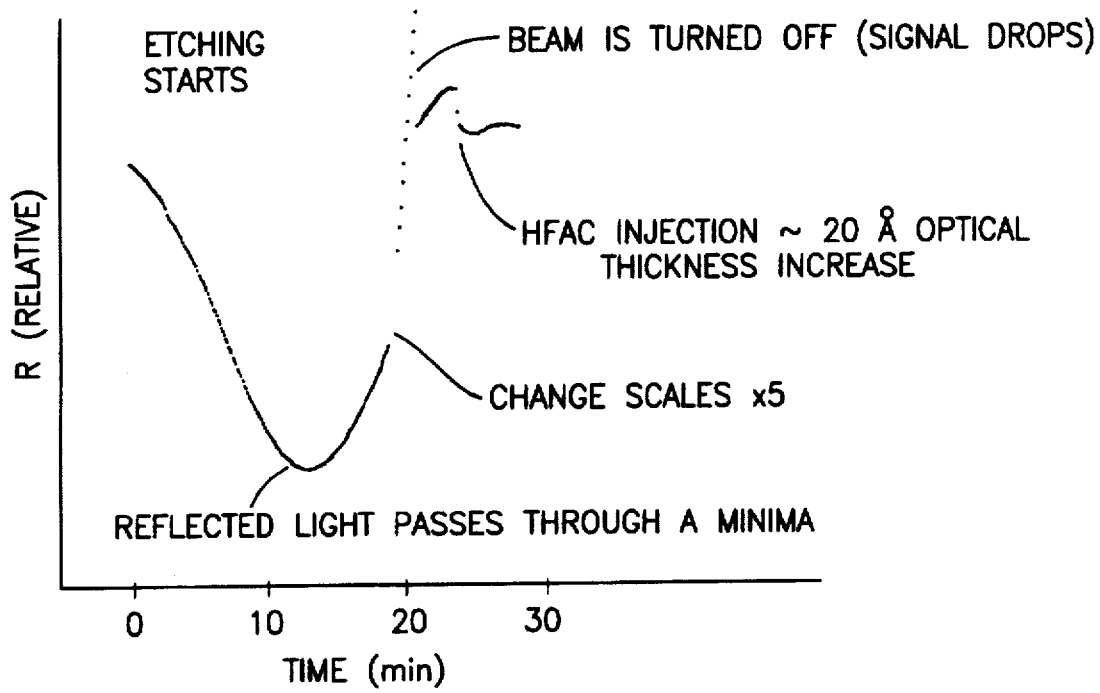
FIG. 2 is a plot of in-situ reflectance vs. time for BST/Pt at λ=632.8 nm., showing an optical thickness increase of about 20 Å caused by injection of hfac ligand to the BST surface.

FIG. 2 shows a plot of in-situ reflectance vs. time for BST/Pt at $\lambda=632.8$ nm. Optical thickness increase of about 20 Å was caused by injection of hfac ligand to the BST surface. The sample was a BST film on Pt/Si, held at 280° C. The abrupt optical thickness increase upon ligand injection may indicate a chemical reaction between the film and the ligand, which could lead to a more volatile compound on the surface. This reaction only occurred if the surface is first reduced via a $NH_3$ ion beam, and is not present if either of these two steps is omitted.

Moving from left to right, the signal first passes through an interference minimum. Peak (not shown) to trough distance corresponds to approximately 630 Å (minimum to maximum distance corresponds to one quarter wavelength optical thickness or 158 nm (based on a He—Ne laser with $\lambda=6133$ nm); a reasonable estimate for BST is n=2.5, so that about 63 nm (630 Å) of material is removed). Continuing to the right (longer time) the scale is then multiplied by a factor of five, causing the signal to change much more steeply as etching takes place (separated dots). The ion beam is cut off, causing a drop in optical signal (this is because the light from the neutralizer filament on the ion gun gives a constant background signal). The optical signal drifts up slowly, possibly due to thermally induced mechanical effects on the substrate position; this drift varied from run to run. When hfac was admitted a drop in signal took place, indicating an optical thickness increase (note direction signal was changing with etching) of about 20 Å. This step change occurred very reproducibly over a range of surface temperatures from 100° C. to 500° C. though its height varied somewhat, and it also was observed with hexamethyldisilazane (HMDS) and with tetraheptanedionate (thd), other ligands which are known to produce volatile Ba compounds. The change did not reverse if the sample was heated up to 500° C. after the surface reaction, indicating that a strong chemical bond was present (the ligand was not desorbing; this was also supported by IR data discussed hereinafter) but that no volatile compound was formed. It did not occur after Ar etching, only after introduction of $NH_3$, and control experiments showed that it was not due to simple reaction with $NH_3$ gas in the chamber over a heated substrate.

The cause of this "step" change was difficult to interpret. It was noted that optical thickness is being monitored, which can be affected by a change in refractive index of the film or its surface, for example re-oxidation of the surface layer after reduction. Several control experiments were done to try to elucidate this optical change. First, it was found that $NH_3$ ion beam reduction followed by admission of wet $O_2$ did not lead to any optical signal change, ruling out re-oxidation of the film surface as a cause. Then toluene, which is inert relative to BST and its hydrides in synthetic chemistry, was injected but was not seen to cause any optical change, indicating that the step is not caused by simple adsorption of hydrocarbons on either the substrate or the optical windows. The best remaining explanation is that the ligands are reacting with a reduced BST surface to form a chemical bond, as is needed to lead to the desired volatile surface compounds. This surface layer may consist of hfac ligands attached to Ba, Sr and Ti atoms, waiting for rearrangement by energetic bombardment to form a volatile organometallic molecule, or it may consist of nonvolatile fluorides or fluorocarbons, which are etching inhibitors.

IR reflection spectroscopy was next performed on the test samples produced in Example 1. Comparisons were made between unetched samples, Ar etched samples, and samples which had been $NH_3$ etched and exposed to hfac. The results are shown in FIGS. 3A, 3B, and 3C.

Figure 3A:
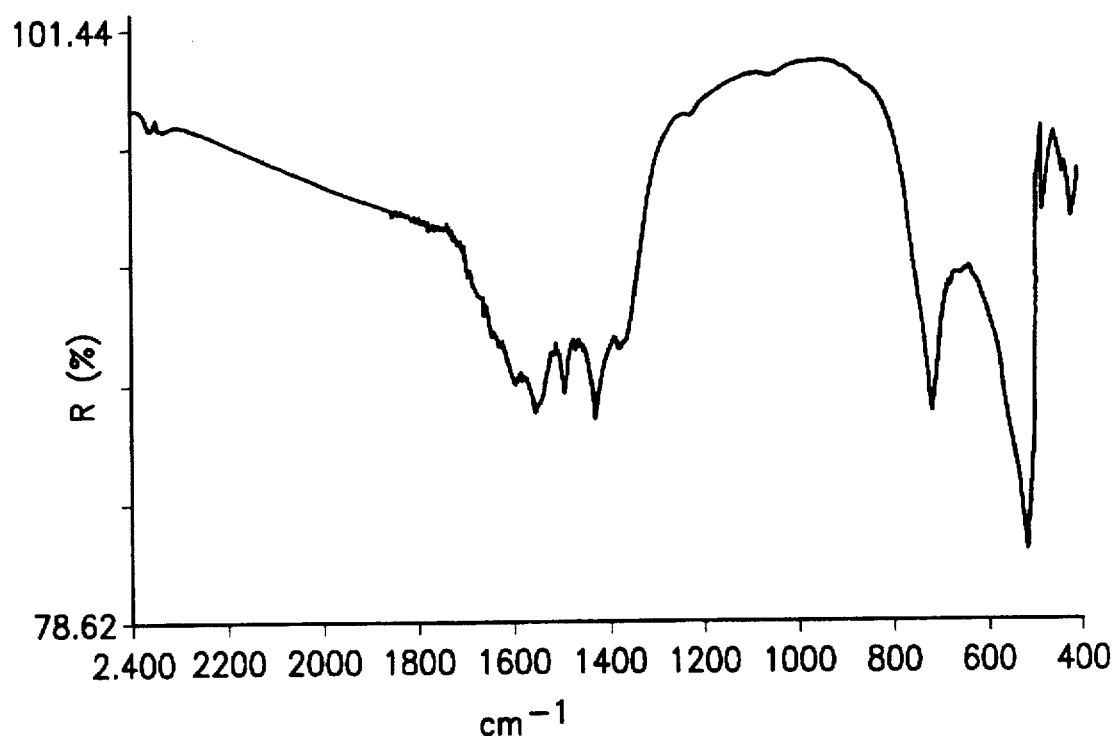
FIG. 3(a) is an infrared spectrum of an unetched BST thin film, 8000 Å thick, showing typical perovskite peaks at 520 and 720 wavenumbers.

FIG. 3A is an infrared spectrum of an unetched BST thin film, 8000 Å thick, showing typical perovskite peaks at 520 and 720 wavenumbers.

Figure 3B:
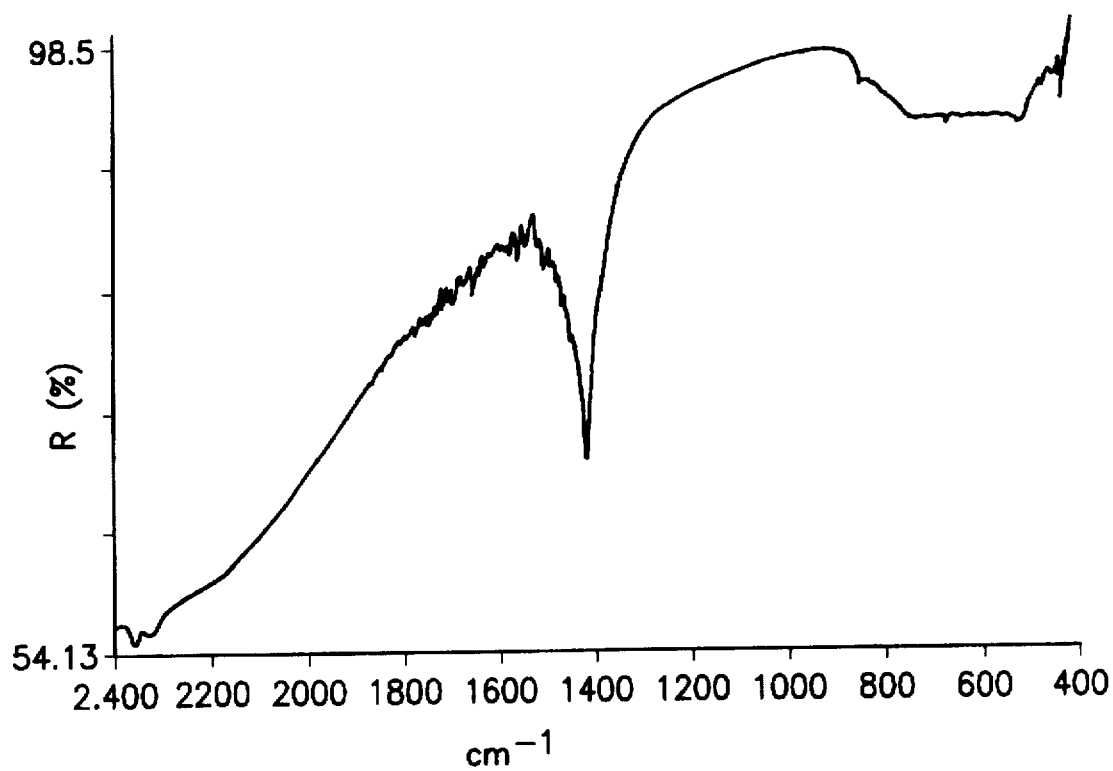
FIG. 3(b) is an infrared spectrum of a BST thin film ion milled with Ar, showing destruction of much of the perovskite phase at the surface.

FIG. 3B is an infrared spectrum of a BST thin film ion milled with Ar, showing destruction of much of the perovskite phase at the surface, confirming that it is not a desirable process for eventual production of device quality films.

Figure 3C:
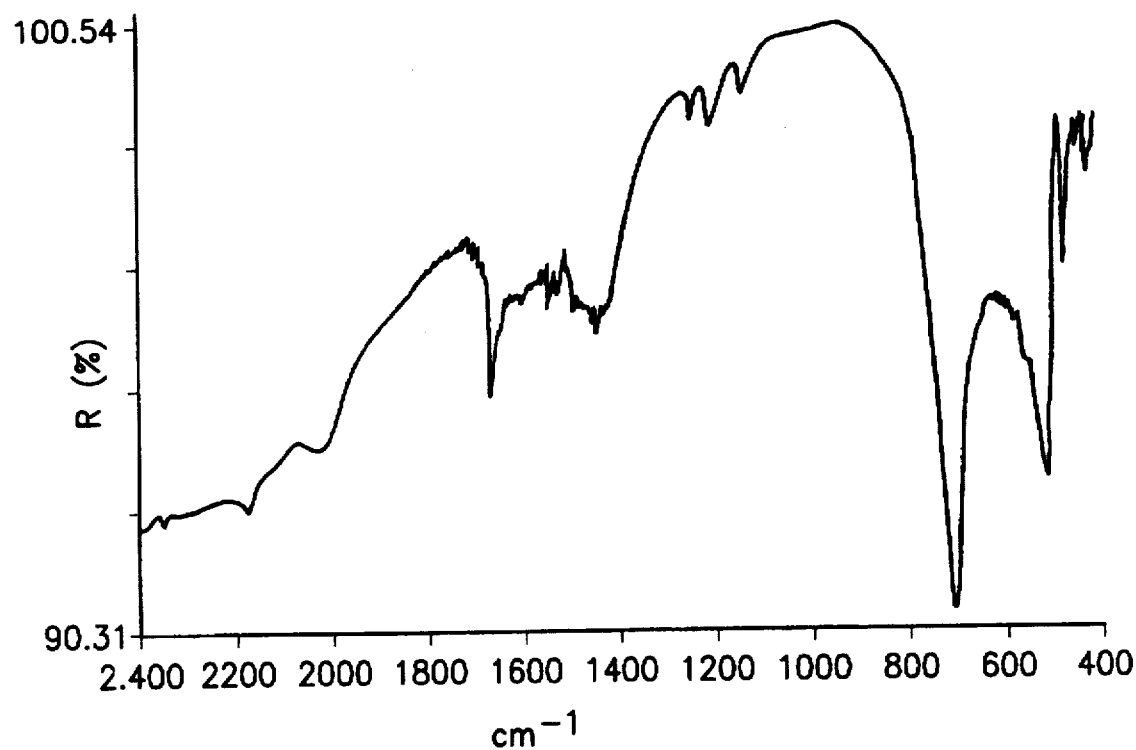
FIG. 3(c) is an infrared spectrum of a BST ion milled and surface activated with $NH_3$, exposed to hfac then heated to 500° C., showing preservation of the perovskite phase and including additional absorption peaks, possibly due to Ba or Sr(hfac) bonds on the surface.

FIG. 3C is an infrared spectrum of a BST ion milled and surface activated with $NH_3$, exposed to hfac then heated to 500° C., showing preservation of the perovskite phase and including additional absorption peaks, possibly due to Ba or Sr(hfac) bonds on the surface, possibly due to Ba or Sr(hfac) bonds on the surface.

FIG. 3A shows the presence of the desirable perovskite phase of the BST, in the peaks at 720 and 520 wavenumbers. The spectrum of the Ar etched sample in FIG. 3B reveals substantial suppression of these perovskite peaks, possibly due to disordering. This damaged, amorphous material would almost certainly cause degradation in electrical properties and leakage in capacitor devices made from such a film, and so should be avoided. Finally, FIG. 3C shows a film which has been $NH_3$ etched followed by hfac exposure and corresponding surface reaction. First, note that the perovskite peaks have returned, indicating restoration of the surface during this chemical etching step. In addition, other small absorption peaks (reflectance minima) are visible at locations which match fairly well with peaks reported in the literature (A. P. Purdy, et al., Inorg. Chem. 28(14), 1989), for $Ba(hfac)_2$ and with peaks we have measured for $Sr(hfac)_2$, as shown in Table 2 below. This is evidence that a chemical reaction is taking place at the surface between the hfac and the BST film, possibly producing a complex similar to that desired, which could be removed with the proper combination of heat and plasma activation.

TABLE 2

IR absorption bands observed for metalorganic complexes

| | | | | | |
|---|---|---|---|---|---|
| BST film surface after $NH_3$ bombardment/hfac | 1665 cm$^{-1}$ | 1455 cm$^{-1}$ | 1260 cm$^{-1}$ | 1220 cm$^{-1}$ | 1147 cm$^{-1}$ |
| $Ba(hfac)_2$ (literature) | 1660 cm$^{-1}$ | 1490 cm$^{-1}$ | 1265 cm$^{-1}$ | 1205 cm$^{-1}$ | 1160 cm$^{-1}$ |
| $Sr(hfac)_2$ (measured here) | 1663 cm$^{-1}$ | 1493 cm$^{-1}$ | 1264 cm$^{-1}$ | 1212 cm$^{-1}$ | 1159 cm$^{-1}$ |

These results evidence the need for the process of the invention to achieve chemically enhanced etching of metal oxide films, in which the surface is reduced from the oxide using an activated species in an ion beam, e.g., $NH_3$. Following such reduction, a ligand such as hfac is injected into the system while the ion beam is not present, allowing a reaction with the surface while preventing premature decomposition of the ligand. Next the ion beam is allowed to strike the surface again, rearranging the ligands and stimulating desorption of volatile species. The beam continues, reducing the next layer of surface from the oxide in preparation to begin the cycle again, as illustrated in FIG. 4.

Figure 4:
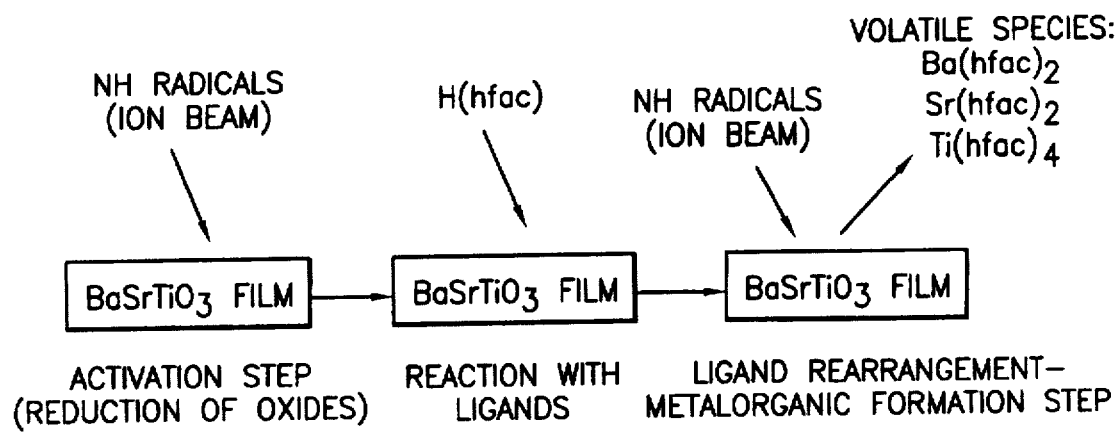
FIG. 4 is a schematic description of a three-step etching process according to one embodiment of the invention, for etching of $BaSrTiO_3$, with surface activation followed by ligand reaction followed by ion-activated desorption of the volatile species.

FIG. 4 is a schematic description of a three-step etching process according to one embodiment of the invention, for etching of $BaSrTiO_3$, with surface activation followed by ligand reaction followed by ion-activated desorption of the volatile species. Such process may be carried out using a mechanical shutter assembly which chops the ion beam near the ion gun, providing control over beam impingement and achieving a three-stage process as described above. Other means may alternatively be employed to accomplish such pulsing, in order to avoid mechanical moving parts in the vacuum system, including those described in "Tungsten etching in pulsed $SF_6$ plasmas," R. Petri, et al., J. Vac. Sci. Technol. B12(5) (1994), p. 2970.

EXAMPLE 2

In the practice of the invention, a layer of partially reacted ligands chemisorbed on a surface may be desorbed by allowing a ion beam to strike it, even if the temperature is not high enough to directly sublimate the partially saturated surface compounds. Several sets of experiments designed to investigate this possibility were carried out. First, using an etching system of the type shown in FIG. 1 and described hereinabove, a BST surface was sputtered with the reducing ion beam. Then, the ion beam was blocked by the blade of the chopper while a dose of ligand was injected into the chamber. After the gas had time to clear, the chopper blade was moved, and the initial etch rate upon re-exposure to the ion beam was monitored. This was compared to the initial etch rate in an identical experiment when no ligand had been injected as a control. A reflectance vs. time plot was used to measure the rate, so the steeper the slope in the chart recorder traces, the faster the etch rate. The ion beam used conditions of 5 mA with 150 V accelerator voltage and a 250

V beam, which gave a very slow etch rate, thus allowing more chance for chemical enhancement to show up relative to sputtering, as well as diffusing the beam to improve uniformity (due to the high accelerator voltage and low beam voltage).

Figure 5:
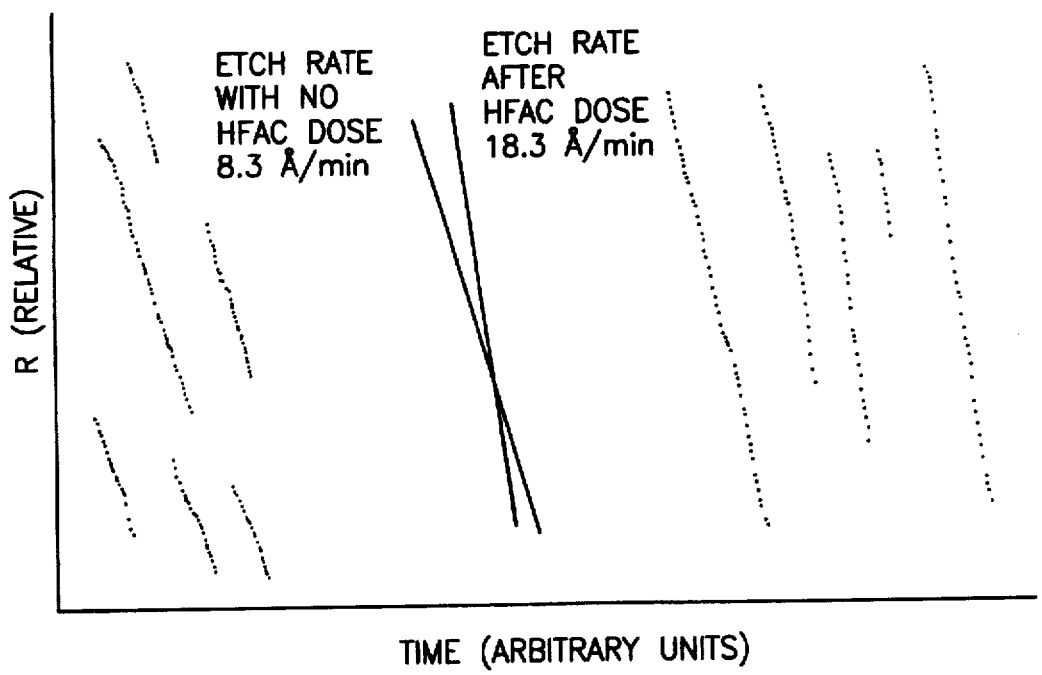
FIG. 5 is a graph of optical traces (reflectance as a function of time) for two sets of etching conditions: with and without hfac exposure while the beam is blocked by the mechanical chopper wherein the two dark lines in the center of the plot represent average slopes for each condition.

The results of this 3-step process with the hfac ligand are shown in FIG. 5. A half a dozen experiments were carried out with hfac, and gave reproducibly faster rates with an hfac dose than without. Actual experiments were alternated between dosing and non-dosing (with the ligand) to make sure that there was no systematic error. In addition, some of the traces in the figure were made on the decreasing optical intensity leg of the sinusoid, and others on the increasing intensity leg. They have all been rotated to lie in the same direction to show the consistency of the data. The average rate when no hfac has been injected was ~8.3 Å/min, after an hfac dose is ~18.3 Å/min, an increase of over 100%.

FIG. 5 is a graph of optical traces (reflectance as a function of time) for two sets of etching conditions: with and without hfac exposure, while the beam is blocked by the mechanical chopper, wherein the two dark lines in the center of the plot represent average slopes for each condition. Each optical trace is a separate experiment. The two dark lines in the center represent the average slopes for each condition, showing a significantly steeper slope when hfac had been used. The absolute value of the slope indicates etch rate, i.e. steeper is faster. Average rate for no hfac is ~8.3 Å/min, after an hfac dose is ~18.3 Å/min, an increase of 100%.

In these experiments, it was expected that as the ligands on the surface were used up, the etch rate would drop to the lower rate seen without an hfac dose. This was not observed, despite total etch distances of about 130 Å for the longer traces above, at which point one would expect to be well into the bulk BST. One possibility (discussed hereinbelow) is continued desorption of ligand from the walls and the inlet tube. This implies that a very low partial pressure of reactant ligand may be optimum, perhaps as low as $10^{-5}$ torr or less. Alternatively, ligands may be redistributed on the surface by the ion beam.

EXAMPLE 3

The same experiments as described in Example 2 above were carried out with Hthd, with no significant increase in etch rate. Since hfac, an organic acid, showed increased etch rate, the experiment was also tried with tfa (trifluoroacetic acid), a stronger organic acid. Little if any etch rate increase was seen. Thus, hfac was the ligand of choice for the next set of experiments.

EXAMPLE 4

The hfac ligand was finally examined in continuous (motorized) chopping experiments, which represented a continuous sequence of the 3-step process of the invention. Substrate temperature during all experiments was 280° C., and a continuous ammonia ion beam was used (chopped at 15 Hz as described above).

The initial beam conditions were 10 mA with 112 V accelerator/750 V beam. This gave a fairly fast etch rate (~1000 Å/hr or 17 Å/min), allowing any chemical enhancement in etch rate to be seen fairly quickly. Under these conditions when hfac was injected, etch rate decreased substantially, as shown in FIG. 6.

The period during which ligand was injected shows very slow etching, and the rate after ligand was discontinued is about the same as the rate before, unlike the cases discussed below. Since this slowdown in etch rate was observed during actual ligand injection, shorter ligand doses were used in later experiments, with liquid hfac only injected for about 1 minute. Total amount of hfac injected per run was estimated to be between 100 and 500 µmol.

Figure 6:
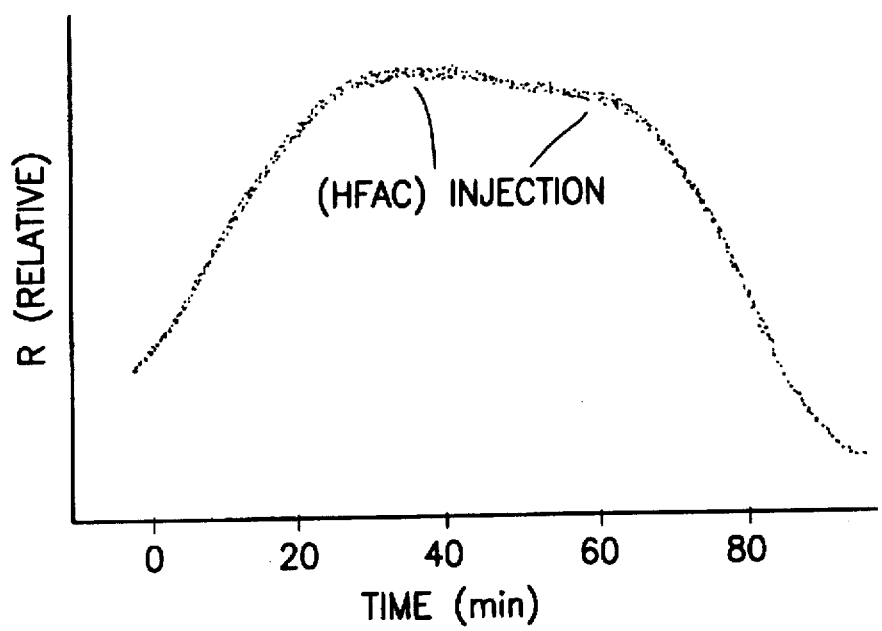
FIG. 6 is a graph of reflectance vs. time during plasma beam chopping, using hfac, with a continuous pure ammonia ion beam being chopped at 15 Hz and 10 mA, with a 750 V beam and 112 V accelerator, on a 280° C. substrate.

FIG. 6 is a graph of reflectance vs. time during motorized chopping, using hfac, with a continuous pure ammonia ion beam being chopped at 15 Hz and 10 mA, with a 750 V beam and 112 V accelerator, on a 280° C. substrate. Notice that etching slowed dramatically during hfac injection, and afterwards the etch rate (slope) was about the same as before ligand exposure.

Figure 7:
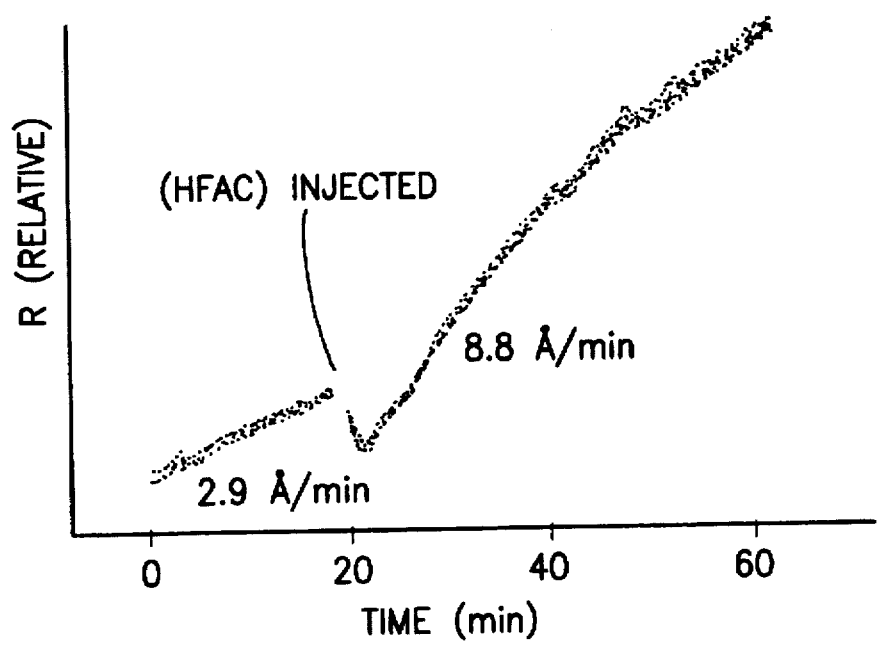
FIG. 7 is a graph of reflectance vs. time, showing comparison of etch rates before, during and after an hfac exposure, with a continuous pure ammonia ion beam being chopped at 15 Hz and 5 mA, with a 250 V beam and 152 V accelerator, on a 280° C. substrate.
Figure 8:
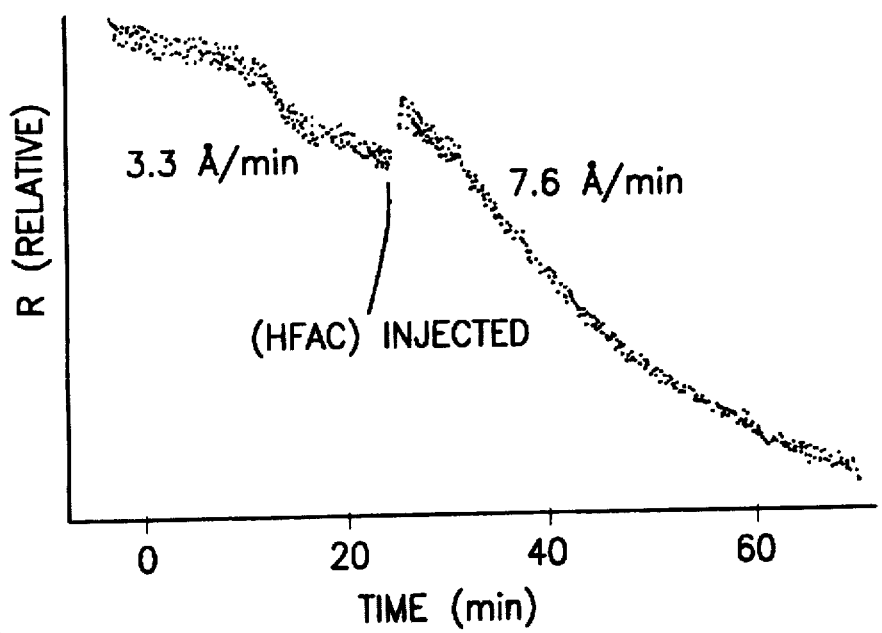
FIG. 8 is a graph of reflectance vs. time, repeating a comparison of etch rates before, during and after an hfac exposure with the beam, chopping and substrate conditions as in the testing for which data is shown in the plot of FIG. 7.

The next set of beam conditions, 5 mA at 150 V accelerator/250 V beam was found to produce a substantial increase in etch rate. A factor of approximately 3 in rate enhancement was observed, going from about 3 Å/min to 9 Å/min. This can be seen in FIGS. 7 and 8, showing separate experiments. This enhancement agrees reasonably well with the non-chopped results illustrated in FIG. 5.

FIG. 7 is a graph of reflectance vs. time, showing comparison of etch rates before, during and after an hfac exposure, with a continuous pure ammonia ion beam being chopped at 15 Hz and 5 mA, with a 250 V beam and 152 V accelerator, on a 280° C. substrate.

FIG. 8 is a graph of reflectance vs. time, repeating a comparison of etch rates before, during and after an hfac exposure with the beam, chopping and substrate conditions as in the testing for which data is shown in the plot of FIG. 7.

The step thickness increase reported previously is still present, but an increased etching rate continues past where any thickness buildup occurs. The etching rate for no hfac dose is 2.9 Å/min, after an hfac dose 8.8 Å/min, an increase of 200%.

EXAMPLE 5

Figure 9:
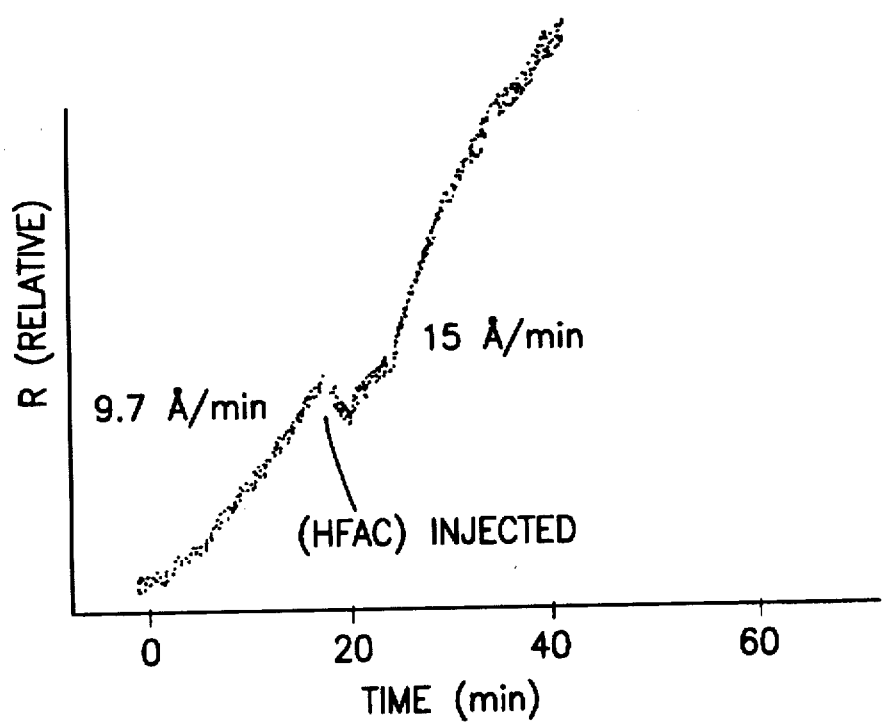
FIG. 9 is a graph of reflectance vs. time, showing comparison of etch rates before, during and after an hfac exposure during plasma beam chopping of a continuous pure ammonia ion beam chopped at 15 Hz, beam conditions 15 mA, 250 V beam, 150 V accelerator, on a 280° C. BST coated substrate.

A further set of experiments was carried out, to generate the reflectance vs. time plot of FIG. 9, repeating the comparison of etch rates before, during and after an hfac exposure with beam, chopping and substrate conditions as in Example 4. Again increased etching rate continued well into the film. The etch rate for no hfac dose was 3.3 Å/min, after an hfac dose 7.6 Å/min, an increase of 130%. FIG. 9 is a reflectance vs. time plot, showing a comparison of etch rates before, during and after an hfac exposure during motorized chopping, for a continuous pure ammonia ion beam chopped at 15 Hz, under beam conditions of 15 mA, 250 V beam, 150 V accelerator, on a 280° C. BST coated substrate. The uneven rate behavior after the optical thickness increase is not fully understood. The etch rate increased after ligand dosing by at least 50%.

Combining the data from the separate experiments described hereinabove gave an average rate for no hfac dose of ~3.1 Å/min, after an hfac dose ~8.2 Å/min, an increase of 165%. In each run, the optical step thickness increase during the hfac dosing was observed for static experiments. This implies that there was some kind of surface fluorocarbon polymer forming, which then was etched more quickly than BST. The main argument against this is that the steep slope showing fast etching in FIG. 4 continued without changing well after the optical thickness increase which occurred at the time the hfac was injected. One would expect such a layer to have a different (probably faster) etch rate. The thickness increase was about 40 Å, while enhanced etching seemed to be taking place for at least 200 Å, which should be well into the bulk of the film.

While we do not wish to be bound by any theory as to the operative mechanism involved, it appears that the reason the rate was accelerated for a significant length of time (at least 200 Å into the film, which corresponds to at least 20 minutes etching) after the initial step downwards is that small amounts of hfac are still around in the system, desorbing from walls and so on, and that with sufficiently small amounts of ligand etch rate is enhanced. Partial pressures of the hfac are probably below $10^{-5}$ torr when desorbing this way (note that at $10^{-6}$ torr, a monolayer of reactant would form on a surface in <1 second and the observed etch rates are ~2 monolayers of BST per minute, so there is still a more than adequate supply rate of hfac to explain these results).

EXAMPLE 6

Figure 10:
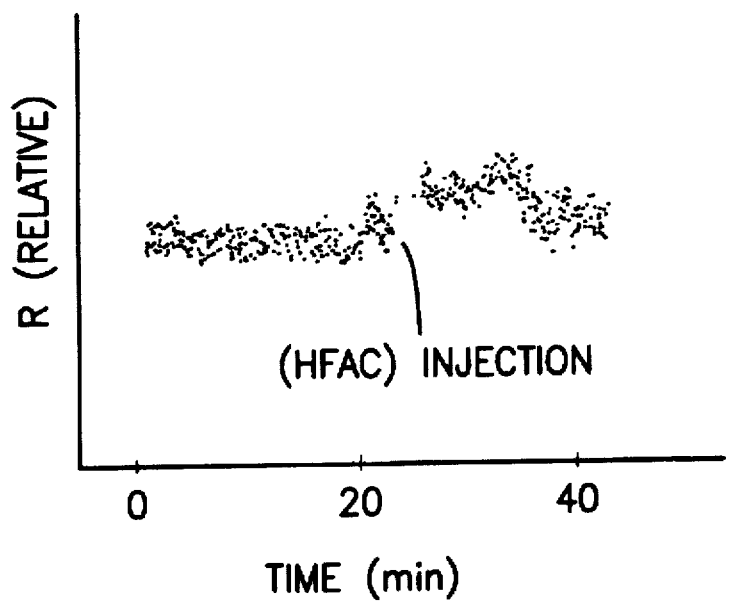
FIG. 10 is a graph of reflectance vs. time, showing comparison of etch rates before, during and after an hfac exposure during plasma beam chopping of a continuous pure ammonia ion beam chopped at 15 Hz, 5 mA, 150 V beam, 150 V accelerator, on a 280° C. substrate.

Beam conditions were surveyed to see if the triple rate etching enhancement of the preceding example could be further improved. First, higher current at the same conditions as in the preceding example was examined (15 mA, 150 $V_a$/250 $V_b$), to determine whether film removal was limited by the availability of energetic electrons/ions; if so, the etch rate would be expected to improve still further with an increase in beam current. Only about a 50% rate increase from the no-ligand-dose control beam etch rate was seen under these conditions, as shown in FIG. 10. Some unexplained behavior was also apparent after ligand injection; the rate started off lower than before injection, but then accelerated and was clearly faster. If this rate increase is averaged including both the slower and faster portions, it yields a final rate of about 15 Å/min, 50% higher.

Finally, low current at extremely low energy was tried (5 mA, 150 $V_a$/150 $V_b$). These parameters were chosen as an extrapolation downwards of the 250 V beam of FIGS. 7 and 8, based on the fact that the 750 V beam did not produce any rate enhancement. This very low energy beam gave virtually zero etch rate with just the ammonia beam, and when hfac was added, the etch rate was still approximately zero, though there were a few changes in the optical signal which may have evidenced some effect, as seen in FIG. 10.

FIG. 10 is a graph of reflectance vs. time, showing comparison of etch rates before, during and after an hfac exposure during motorized chopping of a continuous pure ammonia ion beam chopped at 15 Hz, 5 mA, 150 V beam, 150 V accelerator, on a 280° C. substrate. The uneven rate behavior after the optical thickness increase is not fully understood. No sustained rate increase was seen.

A summary of the etch rate results from the four different types of beam conditions tried, is set out in Table 3 below. The chopping frequency was 15 Hz, and the susceptor temperature was 280° C. Hfac was used as the ligand source. The % increase is relative to identical chopped beam conditions with no ligand.

TABLE 3

| Run # | mA beam | V beam | V accel. | Rate before hfac (Å/min) | Rate after hfac (Å/min) | % rate increase |
|---|---|---|---|---|---|---|
| 1 | 10 | 750 | 112 | 17 | 17 | 0 |
| 2 | 5 | 250 | 150 | 2.9 | 8.8 | 200% |
| 3 | 5 | 250 | 150 | 3.3 | 7.6 | 130% |
| 4 | 15 | 250 | 150 | 9.7 | 15 | 50% |
| 5 | 5 | 150 | 150 | ~0 | ~0 | 0 |

To summarize, the data strongly evidences chemical enhancement of the etch rate due to ligand input. This is supported both by the semi-static experiments of FIG. 5 and the high speed chopping experiments of FIGS. 7 and 8. The best beam condition found was relatively low energy and low intensity. The combined in-situ optical data and the surface analysis data indicate that large amounts of hfac inhibits etching, possibly due to saturation of the surface with excess ligand or via degradation of the ion beam due to increased pressure. Small amounts of ligand resulted in a chemical reaction which increases BST volatility. The enhanced rate was seen to persist well after injection of the hfac.

ESCA analysis was used to provide quantitative analysis of the surface stoichiometry, and indicated that the Ba/Sr/Ti composition was unchanged (within limits of precision, about ±5%) from the unetched reference BST.

Figure 11A:
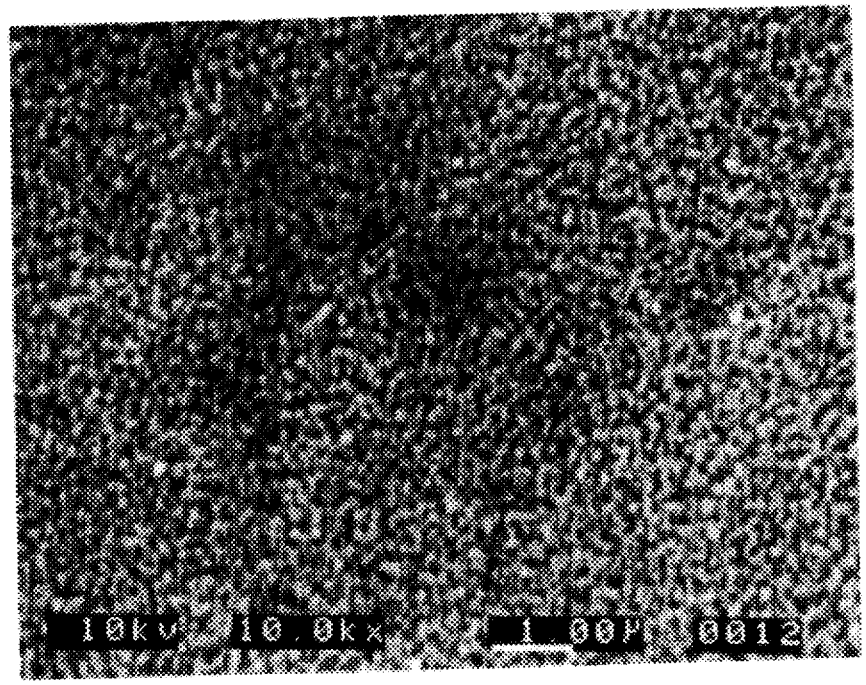
FIG. 11(a) is a SEM micrograph of a 0.8 μm thick BST film grown by, prior to any etching being carried out.
Figure 11B:
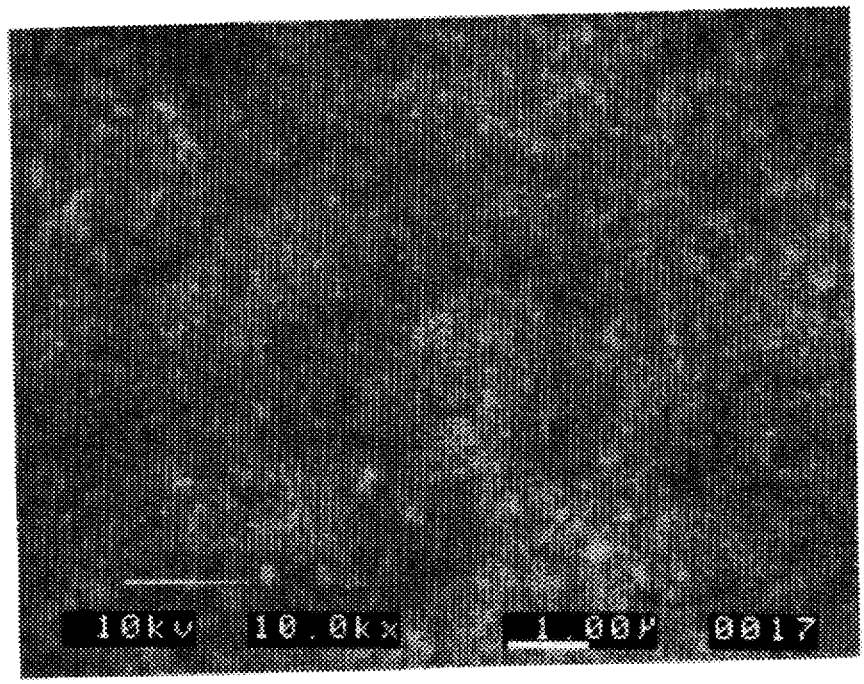
FIG. 11(b) is a SEM micrograph of a 0.8 μm thick BST film grown by MOCVD, after approximately ~3500 Å of material have been etched away in a $NH_3$ ion beam with hfac exposure.

Concerning the effect of etching on the morphology of the film, Ar milling seemed to amorphize the perovskite structure, while $NH_3$ milling followed by hfac exposure preserved it to a much greater extent, at least in terms of IR absorption bands. Scanning electron microscopy (SEM) examination was also performed to look for visible structural damage, such as etch pits. FIGS. 11A and 11B show photomicrographs of the surface of the 0.8 μm thick BST film before and after MEIM etching, respectively.

The BST surface shown in FIG. 11A, of a SEM micrograph of a 0.8 μm thick BST film grown by MOCVD at ATMI, before any etching has taken place, is rather rough, which has also been observed with comparatively thick BST films (0.8 μm). The surface of the MEIM etched film was much smoother, implying the possibility of putting layers over such an etched film without generating holes or thin spots in the top layer from rough underlying morphology. FIG. 11B shows a SEM micrograph of a 0.8 μm thick BST film grown by MOCVD, after approximately ~3500 Å of material have been etched away in a $NH_3$ ion beam with hfac exposure.

These figures above show the advantages of the MEIM technique of the present invention for producing less surface damage on complex oxides. Such minimization of surface damage to the oxide thin film is likely to lead to improved electrical properties, such as reduced leakage, in devices based on these thin films.

Figure 12:
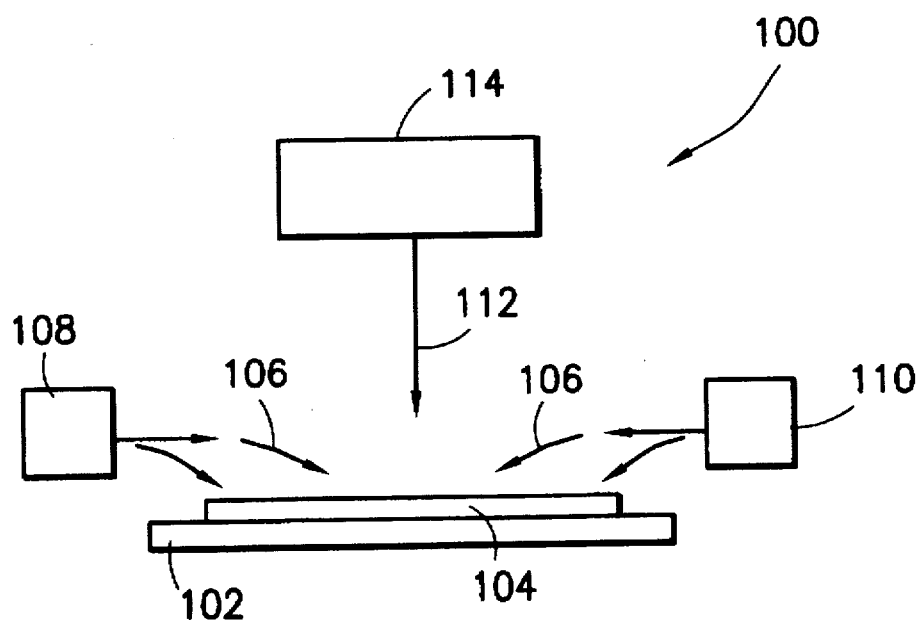
FIG. 12 is a schematic representation of a process system in accordance with another embodiment of the invention, in which the substrate bearing a MOX material film thereon is simultaneously being contacted with an etch enhancing reactant, and being plasma etched.

FIG. 12 is a schematic representation of a process system 100 in accordance with another embodiment of the invention, in which the substrate 102 bearing a metal containing material film 104 thereon is simultaneously being contacted with an etch enhancing reactant 106 from sources 108 and 110, and being plasma etched with plasma 112 from plasma source 114.

In this embodiment of the invention, the plasma 112 is continuously directed at the metal film 104 on substrate 102 in a direction perpendicular to the metal containing film, while simultaneously, the substrate is contacted with the etch enhancing agent 106 being discharged from the sources 108 and 110 in a direction parallel to the metal containing film. The sources 108 and 110 are positioned at an elevation slightly above and in close proximity to the metal containing film, so that the etchingly enhancing agent is contacted with the metal containing film before it is substantially dissociated or otherwise adversely affected by the plasma 112.

In the case of highly labile etch enhancing agents, if the agent were discharged in proximity to the plasma for transport to the substrate, the enhancing agent may, by reason of its resulting increased residence time in the plasma, be substantially decomposed by the plasma into decomposition products which are not enhancingly effective for the removal of the metal film material from the substrate. It will be appreciated that the appropriate relative positioning of the enhancing agent source and of the plasma source may readily be determined in a given process system, by the simple expedient of varying the relative positions of such sources and correlating such relative positions with the character of the metal containing film removal from the substrate.

Although discussed hereinabove primarily in reference to etching of metal oxide films, the process of the present invention also comprehends the etching of elemental metals, including metal species such as platinum, gold, silver, iridium, rhenium, palladium, and rhodium, for which no commercially viable dry etch processes currently exist. In the reactive dry etching of noble metal containing films, appropriate coordinating ligand species may be employed. Illustrative examples include $PF_3$ as an etch enhancing agent for etching of platinum films, to form $Pt(PF_3)_4$, and carbon monoxide as the etch enhancing agent for reactive dry etching of platinum to form $Pt(CO)_4$ as a volatilizable compound for effecting removal of the platinum metal.

In the etching of noble metals, a reducing plasma may not be necessary in the plasma exposure step, but the plasma nonetheless may effectively stimulate complexing reactions between the etch enhancing agent and the metal containing film, and/or stimulate desorption of the corresponding volatile metal-containing species.

The isolation of the plasma exposure to the reactant exposure step may be less critical in the use of etch enhancing reactants such as carbon monoxide, in the etching of platinum, since free oxygen enhances the surface mobility of platinum, thereby potentially enhancing reactions with ligands to form volatile species. Other etch enhancing agents for reactive dry etching of noble metal containing films include lower hydrocarbons, e.g. C1–C4 compounds such as methane and ethane.

While the invention has been described herein in relation to various illustrative aspects, features, and embodiments, it will be recognized that the invention is not thus limited, and that numerous other variations, modifications, and other embodiments of the invention are contemplated, as to which the invention is to be broadly construed, to encompass within its spirit and scope all such alternative variations, modifications, and other embodiments.

What is claimed is:

1. A plasma-assisted dry etching process for etching of a metal-containing material layer on a substrate to remove the metal-containing material from the substrate, comprising (i) plasma etching the metal-containing material and (ii) contacting the metal-containing material with an etch enhancing reactant in a sufficient amount and at a sufficient rate to enhance the etching removal of the metal-containing material from the substrate, wherein (1) the etching plasma is intermittently physically blocked during the contacting of the etch enhancing reactant with the metal-containing material or (2) the etching plasma is a pulsed etching plasma that is pulsed so that it is off when the etch enhancing reactant is contacted with the metal-containing material.

2. A method according to claim 1, where the plasma is intermittently physically blocked from exposure to said substrate during said etch enhancing reactant contacting.

3. A method according to claim 1, wherein the contacting of the metal-containing material with the etch enhancing reactant comprises directing the etch enhancing reactant at the metal-containing material in proximity thereto so that plasma employed in the plasma etching is substantially non-interfering with respect to the reaction between the etch enhancing reactant and the metal-containing material.

4. A method according to claim 1, wherein the plasma etching comprises pulsed plasma etching of the metal-containing material.

5. A method according to claim 1, wherein the metal-containing material comprises a metal oxide film coated on the substrate, and the plasma etching comprises exposing the metal-containing material to a plasma which is reducingly effective for the metal oxide film coated on the substrate.

6. A process according to claim 5, wherein the reducing plasma comprises a reducing gas species selected from the group consisting of ammonia, amines, imines, hydrogen, and C1–C4 hydrocarbons.

7. A process according to claim 5, wherein the reducing plasma is devoid of halogen constituents.

8. A method according to claim 1, wherein the etch enhancing reactant and the metal-containing material are reacted to form a reaction product on the substrate including metal complexed ligand which is volatilizable upon exposure to the plasma; and the metal complexed ligand on the substrate is exposed to the plasma, to volatilize the metal complexed ligand and thereby remove the metal-containing material from the substrate.

9. A process according to claim 1, wherein the substrate is masked prior to initiation of steps (i) and (ii), to thereby effect removal of the metal-containing material from selected area portions thereof.

10. A process according to claim 1, wherein the metal-containing material comprises a metal or an oxide of a metal selected from metals of the group consisting of: Cu, Ba, Sr, La, Nd, Nb, Ce, Pr, Sm, Eu, Th, Gd, Ta, Tb, Ti, Zr, Pt, Pd, Au, Ag, Ir, Pt, Ru, Re, Rh, Dy, Ho, Er, Tm, Yb, Lu, Bi, Tl, Y and Pb.

11. A process according to claim 1, wherein the metal-containing material comprises a metal oxide, and the plasma comprises an inert gas species, and a reducing gas species.

12. A process according to claim 11, wherein the inert gas species comprises a gaseous species selected from the group consisting of helium, argon, neon, xenon, and krypton.

13. A process according to claim 1, wherein the etch enhancing reactant comprises a monodentate or multidentate organic ligand which is coordinatable to the metal of the metal-containing material to yield a metal complexed ligand.

14. A process according to claim 13, wherein the ligand species comprises at least one member selected from the group consisting of β-diketonates, cyclopentadienyls, alkyls, perfluoroalkyls, alkoxides, perfluoroalkoxides, and Schiff bases.

15. A process according to claim 13, wherein the ligand species comprises at least one member selected from the group consisting of β-diketonates and cyclopentadienyls.

16. A process according to claim 13, wherein the ligand species comprises a β-diketonate.

17. A process according to claim 13, wherein the ligand species comprises at least one member selected from the group consisting of the group consisting of:
(i) 2,2,6,6-tetramethyl-3,5-heptanedionate;
(ii) 1,1,15,5,5-hexafluoro-2,4,-pentanedionate;
(iii) 1,1,1,2,2,3,3-heptafluoro-7,7-dimethyl-4,6-octanedionate;
(iv) 4,4'-(ethane-1,2-diyldiimino)bis(3-pentene-2-one);
(v) cyclopentadienyls;
(vi) 2,4-pentanedionate;
(vii) 1,1,1-trifluoro-2,4-pentanedionate; and
(viii) ligands coordinatable with a metal selected from the group consisting of palladium, iridium, platinum, and rhenium, to form a volatile compound of said metal.

18. A process according to claim 1, wherein: said metal-containing material comprises a metal oxide composition selected from the group consisting of BST, SBT and PZT;

said etch enhancing species is selected from the group consisting of hexamethyldisilazane, hexafluoroacetylacetonate, and tetraheptanedionate; and said plasma comprises NH radicals.

19. A plasma-assisted dry etching process for etching of a metal-coating material layer on a substrate to remove the metal-containing material from the substrate, comprising (i) plasma etching the metal-containing material and (ii) contacting the metal-containing material with an etch enhancing reactant in a sufficient amount and at a sufficient rate to enhance the etching removal of the metal-containing material from the substrate, wherein the steps of plasma etching (i) and etch enhancing reactant contacting (ii) are carried out sequentially and repetitively to substantially completely remove the metal-containing material from the substrate, with the plasma etching being stopped during the etch enhancing reactant contacting with the metal-containing material.

20. A plasma-assisted dry etching process for etching of a metal-containing material layer on a substrate to remove the metal-containing material from the substrate, comprising (i) plasma etching the metal-containing material and (ii) contacting the metal-containing material with an etch enhancing reactant in a sufficient amount and at a sufficient rate to enhance the etching removal of the metal-containing material from the substrate, wherein the metal-containing material comprises a metal oxide whose metal moiety is selected from metals of the group consisting of: barium, strontium, lead, zirconium, and titanium, and wherein (1) the etching plasma is intermittently physically blocked during the contacting of the etch enhancing reactant with the metal-containing material or (2) the etching plasma is a pulsed etching plasma that is pulsed so that it is off when the etch enhancing reactant is contacted with the metal-containing material.

21. A plasma-assisted dry etching process for etching of a metal-containing material layer on a substrate to remove the metal-containing material from the substrate, comprising (i) plasma etching the metal-containing material and (ii) contacting the metal-containing material with an etch enhancing reactant in a sufficient amount and at a sufficient rate to enhance the etching removal of the metal-containing material from the substrate, wherein the plasma is pulsed and/or blocked to carry out steps (i) and (ii) in said process, said blocked plasma being intermittently physically blocked while the metal-containing material is contacted with the etch enhancing reagent, and said pulsed plasma being pulsed so that it is off when the etch enhancing reactant is contacted with the metal-containing material.

22. A process according to claim 21, wherein said plasma is pulsed and/or blocked via a technique including at least one step of: intermittent blocking of the plasma; modulation of power to a device for generating said plasma; modulation of the flow rate of said plasma; modulation of the pressure of said plasma; and modulation of the bias potential of said substrate.

23. A plasma-assisted dry etching process for etching of a metal oxide film coated on a substrate to remove the metal oxide film from the substrate, comprising:
   (a) exposing the metal oxide film-coated substrate to a plasma which is reducingly effective for the metal oxide film coated on the substrate, to yield a reduced metal containing film on the substrate;
   (b) discontinuing the exposure of the metal oxide film-coated substrate to the reducingly effective plasma after a predetermined period of exposure;
   (c) during such discontinuance of step (b), contacting the reduced metal film with a ligand species which is reactive with the reduced metal to form a reaction product on the substrate comprising metal complexed ligand which is volatilized upon exposure to the plasma; and
   (d) exposing the metal complexed ligand on the substrate to the plasma, to volatilize the metal complexed ligand and thereby remove the metal from the substrate.

24. A process according to claim 23, wherein the steps (a)–(d) are carried out sequentially and repetitively, to substantially completely remove the metal oxide film from the substrate.

25. A process according to claim 23, wherein the substrate is masked prior to initiation of steps (a)–(d), to thereby effect removal of the metal oxide film from selected area portions thereof.

26. A plasma-assisted dry etching process for etching of a BST metal oxide film coated on a substrate to remove the BST metal oxide film from the substrate, comprising:
   (a) exposing the BST metal oxide film-coated substrate to a plasma comprising NH radicals which is reducingly effective for the BST metal oxide film coated on the substrate, to yield a reduced BST metal film on the substrate;
   (b) discontinuing the exposure of the BST metal oxide film-coated substrate to the reducingly effective plasma after a predetermined period of exposure;
   (c) during such discontinuance of step (b), contacting the reduced BST metal film with a ligand species which is reactive with the reduced metal to form a reaction product on the substrate comprising metal complexed ligand which is volatilized upon exposure to the plasma; and
   (d) exposing the metal complexed ligand on the substrate to the plasma, to volatilize the metal complexed ligand and thereby remove the metal from the substrate.

* * * * *

UNITED STATES PATENT AND TRADEMARK OFFICE
CERTIFICATE OF CORRECTION

PATENT NO. : 5,705,443  
DATED : January 6, 1998  
INVENTOR(S) : Stauf et al.

Page 1 of 2

It is certified that error appears in the above-indentified patent and that said Letters Patent is hereby corrected as shown below:

```
Column 3, line 11         change "rams" to --rates--
Column 5, lines 21-22     change "etchingly" to --etch--
Column 5, line 30         change "metal containing" to --metal-containing--
Column 5, line 42         change "metal containing" to --metal-containing--
Column 5, line 43         change "metal containing" to --metal-containing--
Column 5, line 44         change "metal containing" to --metal-containing--
Column 5, line 49         change "metal containing" to --metal-containing--
Column 5, line 52         change "metal containing" to --metal-containing--
Column 5, line 53         change "metal containing" to --metal-containing--
Column 5, lines 60-61     change "metal containing" to --metal-containing--
Column 5, line 63         change "metal containing" to --metal-containing--
Column 5, line 65         change "metal containing" to --metal-containing--
Column 6, line 2          change "metal containing" to --metal-containing--
Column 6, line 5          change "metal containing" to --metal-containing--
Column 6, lines 7-8       change "metal containing" to --metal-containing--
Column 6, line 24         change "metal containing" to --metal-containing--
Column 6, line 26         change "metal containing" to --metal-containing--
Column 6, line 28         change "metal containing" to --metal-containing--
Column 6, line 32         change "metal containing" to --metal-containing--
Column 6, line 34         change "metal containing" to --metal-containing--
Column 6, line 45         change "metal containing" to --metal-containing--
Column 6, line 54         change "metal containing" to --metal-containing--

Column 8, lines 29-30     change "metal containing" to --metal-containing--
Column 8, line 37         change "metal containing" to --metal-containing--
Column 8, lines 41-42     change "metal containing" to --metal-containing--
Column 8, lines 66-67     change "metal containing" to --metal-containing--
Column 9, line 7          change "metal containing" to --metal-containing--
Column 9, line 10         change "metal containing" to --metal-containing--
```

UNITED STATES PATENT AND TRADEMARK OFFICE
CERTIFICATE OF CORRECTION

PATENT NO. : 5,705,443
DATED : January 6, 1998
INVENTOR(S) : Stauf et al.

It is certified that error appears in the above-indentified patent and that said Letters Patent is hereby corrected as shown below:

| | |
|---|---|
| Column 9, line 49 | change "metal containing" to --metal-containing-- |
| Column 9, line 57 | change "metal containing" to --metal-containing-- |
| Column 10, line 25 | change "1200 1/see" to --1200 1/sec-- |
| Column 12, lines 6-7 | change "metal containing" to --metal-containing-- |
| Column 18, line 51 | change "metal containing" to --metal-containing-- |
| Column 18, line 54 | change "metal containing" to --metal-containing-- |
| Column 18, line 58 | change "metal containing" to --metal-containing-- |
| Column 19, line 5 | change "metal containing" to --metal-containing-- |
| Column 19, line 13 | change "metal containing" to --metal-containing-- |
| Column 19, line 22 | change "metal containing" to --metal-containing-- |
| Column 19, line 31 | change "metal containing" to --metal-containing-- |

Signed and Sealed this

Twenty-third Day of June, 1998

Attest:

BRUCE LEHMAN

*Attesting Officer*    *Commissioner of Patents and Trademarks*